United States Patent [19]

Fujiyama

[11] Patent Number: 4,909,184
[45] Date of Patent: Mar. 20, 1990

[54] APPARATUS FOR THE FORMATION OF A FUNCTIONAL DEPOSITED FILM USING MICROWAVE PLASMA CHEMICAL VAPOR DEPOSITION PROCESS

[75] Inventor: Yasutomo Fujiyama, Tokyo, Japan

[73] Assignee: Canon Kabushiki Kaisha, Tokyo, Japan

[21] Appl. No.: 113,504

[22] Filed: Oct. 28, 1987

[30] Foreign Application Priority Data

Oct. 31, 1986 [JP] Japan .................. 61-259656

[51] Int. Cl.$^4$ ............................. C23C 16/48
[52] U.S. Cl. ................... 118/723; 118/50.1; 333/99 PL
[58] Field of Search .............. 118/723, 50.1; 427/45.1; 333/99 PL

[56] References Cited

U.S. PATENT DOCUMENTS 3,212,034 10/1965 Kaufman et al. .............. 333/99 PL
4,532,199 7/1985 Ueno et al. ..................... 118/723 X Primary Examiner—Evan Lawrence
Attorney, Agent, or Firm—Fitzpatrick, Cella, Harper & Scinto

[57] ABSTRACT

An improved apparatus for the formation of a functional deposited film using microwave plasma chemical vapor deposition process is characterized in that the relative setting angle between waveguides confronting each other is set to be 60° or 240° in the counterclockwise direction, which makes it possible to stably introduce the microwave energy into the vacuum chamber simultaneously from the plural microwave power sources without any interference among them.

3 Claims, 6 Drawing Sheets

APPARATUS FOR THE FORMATION OF A FUNCTIONAL DEPOSITED FILM USING MICROWAVE PLASMA CHEMICAL VAPOR DEPOSITION PROCESS

FIELD OF THE INVENTION

This invention relates to an improved apparatus using microwave plasma chemical vapor deposition process for the formation of a function deposited film such as an amorphous silicon film on a substrate, which is usable especially as a photoconductive member for semiconductor devices, photosensitive devices for use in electrophotography, image input line sensors, image pickup devices, photoelectromotive force devices or the like.

BACKGROUND OF THE INVENTION

Hitherto, as the element member of semiconductor device, photosensitive device for use in electrophotography, image input line sensor, image pickup device, or other optical devices, there have been proposed a number of amorphous semiconductor films, for example, an amorphous deposited film composed of a silicon containing amorphous material compensated with hydrogen atom or/and halogen atom such as fluorine atom or chlorine atom [hereinafter referred to as "A-Si(H,X)"]. Some of such films have been put to practical use.

Along with these amorphous semiconductor films, there have been proposed various method for their preparation using plasma chemical vapor deposition technique wherein a raw material is decomposed by subjecting it to the action of an energy of direct current, high frequency or microwave glow discharging to thereby form a deposited film on a substrate of glass, quartz, heat-resistant resin, stainless steel or aluminum. There have been also proposed various apparatus for practicing such methods.

Now, in recent years, the public attention has been focused on plasma chemical vapor deposition process by means of microwave glow discharging [hereinafter expressed by the abbreviation "MW-PCVD process"] also at industrial level.

Figure 2:
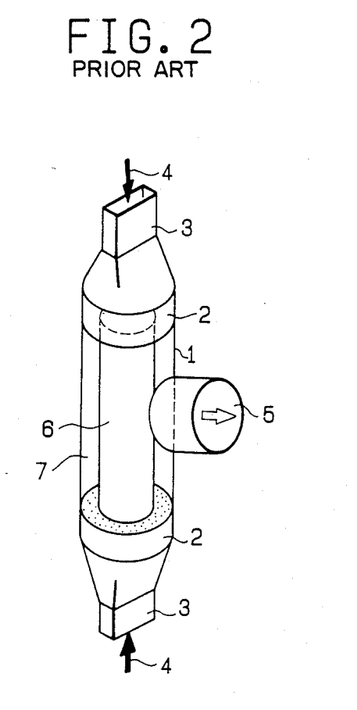
FIG. 2 is a schematic perspective view illustrating the foregoing known apparatus for the formation of a functional deposited film using MW-PCVD process.

One representative apparatus for practicing such an MW-PCVD process is that which has a structure as shown in the schematic perspective drawing of FIG. 2.

In FIG. 2, there are shown a whole vacuum chamber 1, a microwave introducing window 2 which is made of a dielectric material such as alumina ceramics or quartz, a waveguide 3 which propagates microwave 4 generated from a microwave power source (not shown), an exhaust pipe 5 being connected through an exhaust valve (not shown) to an exhaust apparatus (not shown), a substrate 6 onto which a deposited film is to be formed and a substantially enclosed deposition space 7 (plasma generating space).

The film forming operation in the above-mentioned apparatus is carried out in the following way.

That is, the air in the vacuum chamber 1 is evacuated by opening the main valve of the exhaust pipe 5 to bring the deposition space of the vacuum chamber to a predetermined vacuum. A heater (not shown) installed in a substrate holder (not shown) is actuated to uniformly heat the substrate 6 to a predetermined temperature and to maintain that temperature.

Then, raw material gases, for instance, silane gas such as $SiH_4$ gas and hydrogen gas ($H_2$ gas) etc. in the case of forming a silicon containing amorphous deposited film, are introduced into the deposition space 7 of the vacuum chamber 1 through the gas feeding means (not shown) while maintaining the deposition space at a vacuum of less than $1 \times 10^{-2}$ Torr.

Successively, microwave 4 having a frequency, for example, of 2.45 GHz from the microwave power source (not shown) is introduced through an isolator, a power monitor, a stub tuner (these are not shown), then through the wave guide 3 and the microwave introducing window 2 into the deposition space 7. The raw material gases thus introduced into the deposition space 7 are excited and dissociated by an energy of the microwave to generate plasmas and to cause chemical reactions among them resulting in formation of a deposited film on the surface of the substrate 6.

By the way, the plasmas thus generated function as a kind of absorber or reflector for microwave which has a tendency to space-propagate within a dielectric medium. The density of the plasmas becomes reduced as the vacuum degree is raised because the mean free path of charged particles becomes longer. Because of this, when the vacuum degree at the time of forming plasmas is high, it becomes possible to make the propagation length of the microwaves longer.

However, in the case where a deposited film is intended to form utilizing mainly neutral radical particles, the lower limit of the vacuum degree lies in the order of $10^{-3}$ Torr. Therefore, in the case where a deposited film is intended to form on a large surface area substrate such as a cylindrical substrate (drum) for use in electrophotography, it is difficult to generate plasmas uniformly all over the surface of such drum. In this respect, there is employed the type of apparatus using the MW-PCVD process as shown in FIG. 2 in which microwave energies with the same resonant mode are introduced from both the upper and lower sides of the drum to thereby generate plasmas.

In such known MW-PCVD apparatus, the relative setting angle between the waveguides 3 connected respectively to the upper and lower microwave introducing windows 2 which resonate with $TE_{11}$ mode is made 0°. Because of this, there is a problem that the microwaves introduced often adversely penetrate the respective waveguides opposite each other and cause undesired damage on the respective isolators. There is also another problem that those microwaves which remain not polarized sufficiently by the magnetic field of the isolator penetrate the respective magnetrons of the microwave power sources and interfere with the microwaves therefrom to thereby interfere with the oscillation of microwave.

SUMMARY OF THE INVENTION

This invention is aimed at eliminating the foregoing problems in the conventional apparatus for the formation of a deposited film using the MW-PCVD process and an improved apparatus for practicing the MW-PCVD process which enables one to stably form a desirable functional deposited film which is usable as an element member for semiconductor devices, photosensitive devices of electrophotography, photoelectromotive force members, or other electronic and optical devices at a high deposition rate.

Another object of this invention is to provide an improved apparatus for forming an A-Si(H,X) deposited film using the MW-PCVD process in which, while microwave energy is efficiently used to uniformly deposit an A-Si(H,X) film, plasmas are stably generated for a long period of time.

BRIEF DESCRIPTION OF THE DRAWINGS

For a better understanding of this invention and further features thereof, reference is made to the following detailed description of various preferred embodiments wherein.

DESCRIPTION OF THE INVENTION AND THE PREFERRED EMBODIMENTS

The present inventor has conducted extensive studies for overcoming the foregoing problems on the known apparatus for the formation of a functional deposited film using MW-PCVD process and attaining the objects of this invention as mentioned above and as a result, the present inventor has obtained a finding that, in order to prevent microwaves from penetrating into the mutual waveguides and interfering with each other, it is the most effective to suitably select the relative setting angle of the waveguides.

Based on the above finding, the present inventor has continued extensive studies and as a result, has come to finding facts that, in the case where the relative setting angle between the two waveguides is made 60° or 240° in the counterclockwise direction, it becomes possible to sufficiently prevent occurrence of such mutual penetration of the microwaves, which is found on the known MW-PCVD apparatus.

And, it has been confirmed that this condition is effective not only in the case where the structure of a deposition chamber is different but also in the case where the resonant mode of a deposition chamber is different as long as the waveguides are connected to the respective microwave introducing windows having the same resonant mode and are arranged to face each other through the vacuum chamber.

This invention has been completed based on the above findings. The apparatus for the formation of a functional deposited film using the MW-PCVD process according to this invention comprises a substantially enclosed vacuum chamber having a deposition space which is equipped with a waveguide for microwave from a microwave power source at the two positions being opposite each other and which provides two microwave introducing windows corresponding to the respective waveguides, a substrate supporting means in which an electric heater being installed, a means for supplying raw material gases into the deposition space and a means for exhausting the deposition space, and it is characterized in that the two waveguides being so arranged as to make a relative angle of 60° or 240° in the counterclockwise direction between them through the deposition space.

In the apparatus having the above-mentioned structure according to this invention, the vacuum chamber is formed with a surrounding wall made of a conductive material having a cylindrically shaped deposition space. A conductive and coaxial cylinder substrate is placed in the deposition space, so that there is provided a microwave coaxial resonant structure. Because of this structure, a microwave energy introduced becomes efficiently converted into plasmas and absorbed within the system.

For the apparatus according to this invention, in view of controlling the vacuum degree of the deposition space to a value of $1 \times 10^{-2}$ Torr or less and also having due regard for the reflection and absorption of microwave by plasmas, it is desired to structurally connect the vacuum chamber and the waveguides by means of microwave introducing windows made of a dielectric material which also functions as a vacuum sealing means.

In addition, in a detailed embodiment of the apparatus according to this invention, since it is so designed that the vacuum chamber is provided with an exhaust pipe being connected to an exhaust apparatus at its proper portion, in order to prevent the resonant frequency from shifting due to penetration of microwave into the exhaust pipe, it is desired to place a proper microwave shield member being so designed as not to increase the exhaust resistance onto the opening into the deposition space of the exhaust pipe.

In the apparatus for the formation of a functional deposited film using the MW-PCVD process according to this invention, the relative setting angle between the waveguides while confronting each other is set to be 60° or 240° in the counterclockwise direction. That enables one to stably introduce a microwave energy into the vacuum chamber simultaneously from the plural microwave power sources without any interference among the microwaves to be introduced.

This invention will be more detailed on the basis of the experimental results which will be below mentioned with reference to the drawings.

Figure 1:
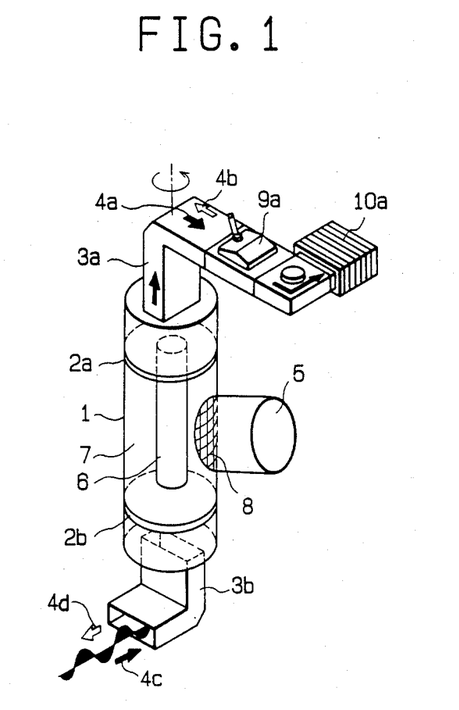
FIG. 1 is a schematic perspective view illustrating a representative embodiment of the apparatus for the formation of a functional deposited film using the MW-PCVD process according to this invention with which a measuring instrument is provided.

A typical example of the apparatus according to this invention is as shown in FIG. 1, in which are shown a vacuum chamber 1 having a deposition space 7, an upper and lower microwave introducing window 2a and 2b made of a dielectric material such as alumina ceramics or quartz, upper and lower waveguides 3a and 3b which propagate microwave powers from microwave power sources (not shown), an exhaust pipe 5 being connected through an exhaust valve to an exhaust apparatus (not shown), a conductive cylinder substrate 6 being placed on a substrate holder in which an electric heater being installed (not shown), and a microwave shield member 8 being placed onto the opening into the deposition space 7 of the exhaust pipe 5.

There are also shown a penetrating microwave power 4a and a reflected microwave power 4b in the upper waveguide, and a travelling microwave power 4c and a reflected microwave power 4d in the lower waveguide 3b.

And, there is provided a measuring instrument comprising a power monitor 9a and an isolator 10a with the apparatus.

The film forming operation in the apparatus shown in FIG. 1 is carried out in the same way as in the case of the known apparatus shown in FIG. 2.

Now, the movements of microwave power between the upper and lower waveguides 3a and 3b through the vacuum chamber 1 using the measuring instrument being attached to the apparatus is as follows.

The traveling microwave power 4c form a microwave power source (not shown) is introduced into the lower waveguide 3b through an isolator and a power monitor (these are not shown). The microwave is propagated with $TE_{10}$ resonant mode through the lower waveguide 3b, the lower microwave introducing window 2b of $TE_{11}$ mode and the vacuum chamber 1 having a coaxial resonant mode respectively. In this case, a part of the microwave reaches the upper microwave introducing window 2a and a part of which returns to the lower waveguide 3b as a reflected microwave power 4d.

The microwave propagated into the upper microwave introducing window 2a penetrates into the waveguide 3a depending upon the relative setting angle between the upper waveguide 3a and the lower waveguide 3b.

In order to confirm this situation, a microwave power to be penetrated, that is, the penetrating microwave power 4a was measured by means of the power monitor 9a. As a result, it was found that most of the penetrating microwave power 4a is absorbed in the isolater 10a, but a slight microwave power reflected by a guide wall, etc., that is, the reflected microwave power 4b returns through the waveguide 3a into the vacuum chamber 1.

In that event, the upper microwave introducing window 2a and the upper waveguide 3a were so structurally designed as to be rotatable around the apparent axis which is held in common with the lower waveguide 3b. And, the angle parallel with the direction of the electric field of the lower waveguide 3b having $TE_{10}$ resonant mode is defined as 0°, and the relative angle between this and the direction of the electric field of the upper waveguide 3a having the same $TE_{10}$ resonant mode is defined as $\theta$° in the counterclockwise direction.

Figure 3A:
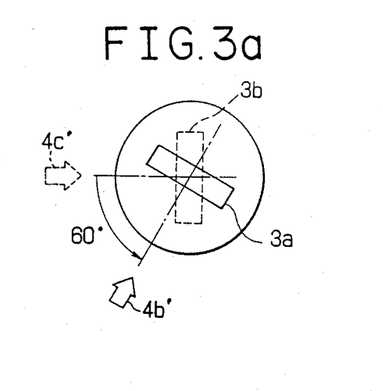
FIG. 3(a) and FIG. 4(a) are schematic explanatory views respectively for the relationship of a relative setting angle between the waveguides.

In FIG. 3(a), there is illustrated the situation of a relative setting angle between the upper and lower waveguides 3a and 3b in a typical example of the apparatus according to this invention, in which are shown a microwave traveling direction 4b' in the upper waveguide 3a and a microwave traveling direction 4c' in the lower waveguide 3b. In the case of FIG. 3(a), the upper waveguide 3a is so set as to make a counterclockwise angle of 60° to the lower waveguide 3b along the microwave propagating direction.

Figure 3B:
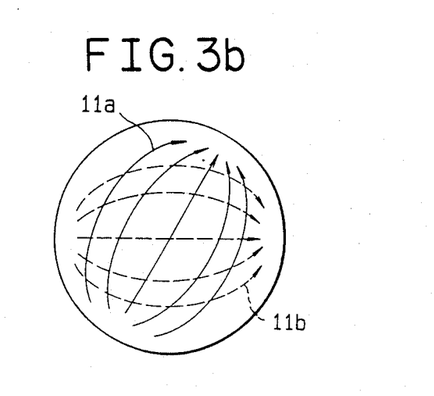
FIG. 3(b) and FIG. 4(b) are schematic explanatory views respectively for the direction and the distribution state of a line of electric force in the case of FIG. 3(a) and in the case of FIG. 4(a)

The direction and distribution for each line of electric force in the above case becomes such as shown in FIG. 3(b), in which are shown a line of electric force for the microwave in the upper waveguide 3a which is expressed by a solid line 11a and a line of electric force for the microwave in the lower waveguide 3b which is expressed by a broken line 11b.

Figure 4A:
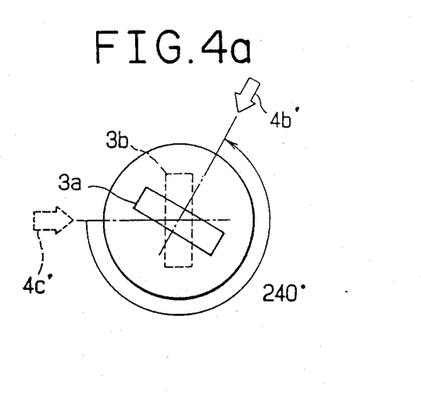
Figure 4B:
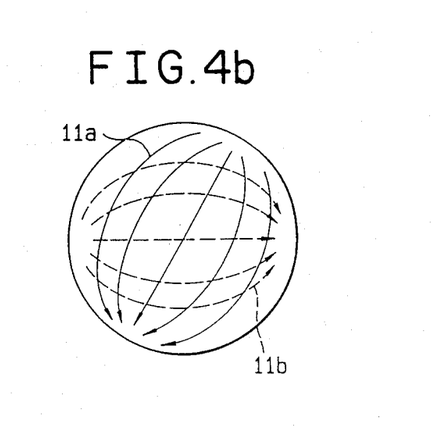

There is illustrated another situation of the foregoing relative setting angle between the two waveguides in FIG. 4(a) in another typical example of the apparatus according to this invention. In the case of FIG. 4(a), the upper waveguide 3a is so set as to make a counterclockwise angle of 240° to the lower waveguide 3b along the microwave propagating direction. The direction and distribution for each line of electric force in that case becomes such as shown in FIG. 4(b).

Figure 5:
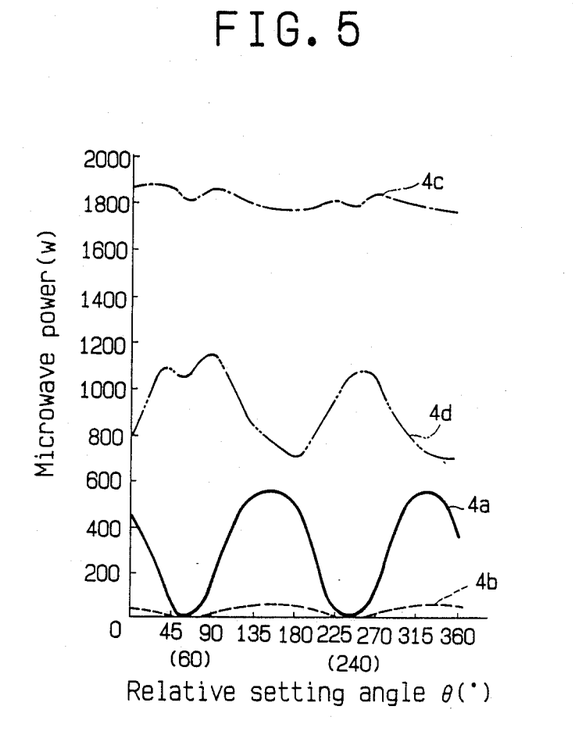
FIG. 5 shows a graph illustrating the relationship between a relative setting angle between the waveguides, and a microwave power.

In FIG. 5, there are shown the movements of microwave power with respect to various relative setting angles between the upper and lower waveguides 3a and 3b which were confirmed by the experiments using the apparatus having the measuring instrument shown in FIG. 1. The condition of such measurement is that the inner atmosphere of the deposition space 7 of the vacuum chamber 1 is adjusted to atmospheric pressure having a relative dielectric constant of 1. That allows effective transmission of microwaves in view of reducing an apparent change of the penetrating microwave power 4a due to damping of microwave power by plasmas.

In FIG. 5, the abscissa represents a relative setting angle ($\theta$°) of a waveguide in the counterclockwise direction and the ordinate represents a microwave power (w), and the curve 4a represents a penetrating microwave power in the upper waveguide, the curve 4b represents a reflected microwave power in the upper waveguide, the curve 4c represents a traveling microwave power in the lower waveguide and the curve 4d represents a reflected microwave power in the lower waveguide.

As FIG. 5 illustrates, the magnitude of the penetrating microwave power 4a changes periodically in accordance with the increase of the relative setting angle between the two waveguides. The period for such change is 180°. The penetrating microwave power 4a is substantially cut off and becomes zero W at 60° and at 240° for the relative angle between the two waveguides. The magnitude of the reflected microwave power 4b in the upper waveguide also changes with the same period because it is in proportion to that of the penetrating microwave power 4a.

As for the magnitude of the reflected microwave power 4d in the lower waveguide, it changes with the same period as in the above case but is in inverse proportion to that of the penetrating microwave power 4a because the reflection of microwave at the entrance of the upper waveguide 3a becomes maximum when the penetrating microwave power 4a becomes zero W.

In addition, when the relative setting angle between the two waveguides in made 0° as in the case of the known apparatus shown in FIG. 2, the penetrating microwave power becomes undesirably large. Moreover, at the relative setting angle of 60° in the clockwise direction or at the counterclockwise angle of 300°, the penetrating microwave power also becomes undesirably large.

In view of the above, it has been confirmed that it is required for the relative setting angle between the upper and lower waveguides to be designed at 60° or at 240° in the counterclockwise direction in order to immobilize the apparatus shown in FIG. 1 to be suited for the formation of a functional deposited film using the MW-PCVD process.

In fact, as long as the relative angle between the upper and lower waveguides being set to 60° or 240° in the counterclockwise direction for the apparatus shown in FIG. 1, plasmas are generated uniformly over the space surrounding the substrate to thereby promote the formation of a deposited film having an uniform thickness and an uniform quality without occurrence of the foregoing problems due to undesired movements of a microwave power which is found on the known apparatus.

Confirmative Experiments

A deposited film composed of A-Si:H material was attempted to be formed on an aluminum cylinder of 80 mm in diameter and 360 mm in length using the apparatus shown in FIG. 1 and by varying the relativge angle between the upper and lower waveguides 3a and 3b in the counterclockwise direction under the following conditions.

| Gas used & its flow rate: | SiH$_4$ gas 500 SCCM |
| --- | --- |
| | H$_2$ gas 200 SCCM |
| Substrate temperature: | 260° C. at the beginning stage |
| | 320° C. at the final stage |
| Inner pressure: | $2 \times 10^{-3}$ Torr |
| Microwave power to be applied: | 0.9 kw for each of the waveguides |

Figure 6:
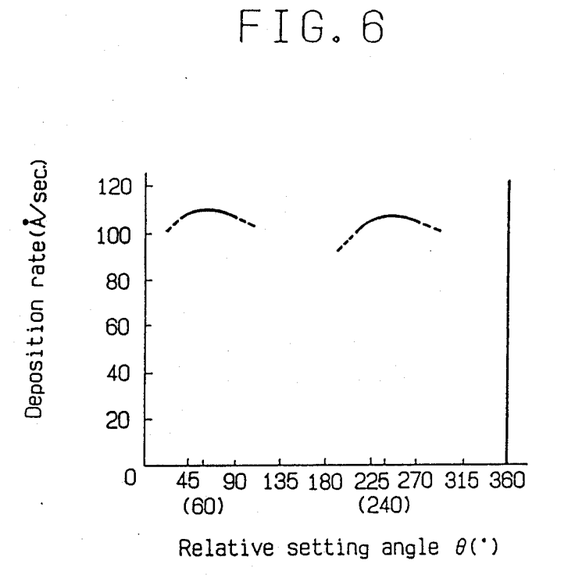
FIG. 6 shows a graph illustrating the relationship between a relative setting angle between the waveguides and a film deposition rate.

As a result, there were obtained the results as shown in FIG. 6, in which the abscissa represents the relative setting angle θ° between the waveguides in the counterclockwise direction and the ordinate represents the film deposition rate (Å/sec).

Figure 7:
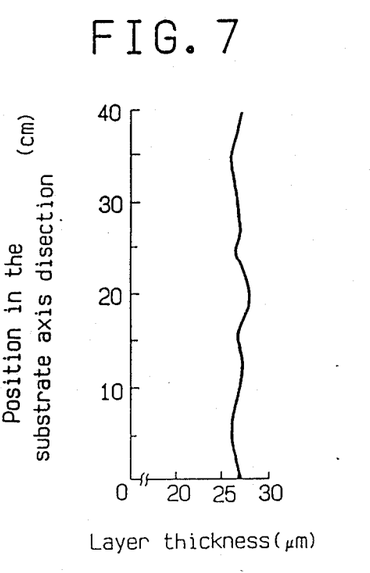
FIG. 7 shows a graph illustrating the film thickness distribution in the substrate axial direction in the case where the relative setting angle is 240° in the counterclockwise direction.

As FIG. 6 illustrates, in the case where the relative angle between the two waveguides 3a and 3b is made 60° or 240° in the counterclockwise direction, a desired film deposition rate is attained. In each of the above cases, a desired deposited film having a desirable film thickness distribution as shown in FIG. 7 was obtained. In FIG. 7, the abscissa represents the film thickness and the ordinate represents the position in the substrate axis direction.

From the results shown in FIG. 6, it can be recognized that when the relative angle between the waveguides 3a and 3b shifts from 60° or from 240°, a desired film deposition rate cannot be attained. As a result, the resulting deposited film has an undesired uneven film thickness and an undesired uneven film quality.

It was also found that as the relative angle between the waveguides 3a and 3b shifts from 60° or from 240°, the penetrating microwave power increases and propagates into the magnetron so that the oscillation becomes unstable, and at last, the discharge becomes discontinued (this situation being shown as the blank area in FIG. 6). Such apparatus using the MW-PCVD process for production of a deposited film, which has microwave introducing windows of the same resonant mode being arranged to confront each other on the microwave traveling course, therefore is not limited by the structure or the resonant mode for the deposition space of the vacuum chamber in which plasmas are to be generated.

In this connection, this invention is effective for other kinds of deposition space structure than the coaxial resonant deposition space structure as above-mentioned, for example, such as a circular cavity resonant deposition space structure and the like.

Further, this invention can be employed in the case of an apparatus for the heat treatment of a material using a microwave energy other than the case of an apparatus for the purpose of conducting plasma treatment using a microwave energy.

What is claimed is:

1. In an apparatus for the formation of a functional deposited film on a substrate by means of a microwave plasma chemical vapor deposition process conducted in a substantially enclosed deposition chamber comprising a circumferential wall having upper and lower end portions thereof, each of said end portions being vacuum-sealed to a microwave introducing window to which a waveguide extending from a microwave power source is connected, wherein a first propagated microwave traveling from one of the microwave introducing windows into said deposition space meets an opposing second propagated microwave traveling from the opposing microwave introducing window, each of said first and second propagated microwaves containing, respectively, a first and second electric force component traveling along the path of each respective microwave and extending at a radial vector direction from the microwave propagating axis, said deposition chamber having a deposition space in which a supporting means for said substrate is installed, said deposition chamber being provided with the means for supplying a film-forming raw material gas and means for evacuating said deposition chamber, the improvement which comprises each said microwave introducing window having the same resonant mode, and each said waveguide being oriented such that the paths of said first and second microwaves meet in said deposition space wherein the said first and second electric force vectors are superposed forming a relative setting angle of 60° or 240° when viewed from the direction of the first propagating microwave and measured counter-clockwise from the second electric force vector to the first electric force vector.

2. The apparatus according to claim 1, wherein the deposition chamber has a microwave resonant structure.

3. The apparatus according to claim 1, wherein each of said pair of waveguides is structurally connected through the corresponding microwave introducing window to the deposition chamber.

* * * * *

UNITED STATES PATENT AND TRADEMARK OFFICE
CERTIFICATE OF CORRECTION

PATENT NO. : 4,909,184
DATED : March 20, 1990
INVENTOR(S) : YASUTOMO FUJIYAMA

It is certified that error appears in the above-identified patent and that said Letters Patent is hereby corrected as shown below:

SHEET 4 OF 4

FIG. 7, "disection" should read --direction--.

COLUMN 1

Line 29, "method" should read --methods--.
Line 46, "are" should read --is--.

COLUMN 3

Line 43, "the" should be deleted.

COLUMN 5

Line 13, "form" should read --from--.
Line 60, "are" should read --is--.

COLUMN 6

Line 67, "an" should read --a--.
Line 68, "an" should read --a--.

UNITED STATES PATENT AND TRADEMARK OFFICE
CERTIFICATE OF CORRECTION

PATENT NO. : 4,909,184
DATED : March 20, 1990
INVENTOR(S) : YASUTOMO FUJIYAMA

It is certified that error appears in the above-identified patent and that said Letters Patent is hereby corrected as shown below:

COLUMN 8

Line 24, "deposition space" should read --deposition chamber--.

Signed and Sealed this

Thirtieth Day of July, 1991

Attest:

HARRY F. MANBECK, JR.

*Attesting Officer*     *Commissioner of Patents and Trademarks*